United States Patent
Sunwoo et al.

(10) Patent No.: US 7,241,966 B2
(45) Date of Patent: Jul. 10, 2007

(54) WAFER LEVEL PACKAGE FABRICATION METHOD USING LASER ILLUMINATION

(75) Inventors: Kook Hyun Sunwoo, Choongchungnam-do (KR); Jong Oh Kwon, Kyungki-do (KR); Joo Ho Lee, Seoul (KR)

(73) Assignee: Samsung Electro-Mechanics Co., Ltd., Kyungki-Do (KR)

( * ) Notice: Subject to any disclaimer, the term of this patent is extended or adjusted under 35 U.S.C. 154(b) by 0 days.

(21) Appl. No.: 10/980,304

(22) Filed: Nov. 4, 2004

(65) Prior Publication Data

US 2006/0049155 A1    Mar. 9, 2006

(30) Foreign Application Priority Data

Sep. 2, 2004   (KR)   .................. 10-2004-0069892

(51) Int. Cl.
- B23K 26/32 (2006.01)
- B23K 101/40 (2006.01)
- H01L 21/00 (2006.01)
- H01L 21/52 (2006.01)

(52) U.S. Cl. .................. 219/121.64; 438/127; 228/120
(58) Field of Classification Search ........... 219/121.63–121.66; 438/113, 127; 228/120
See application file for complete search history.

(56) References Cited

U.S. PATENT DOCUMENTS

| | | | |
|---|---|---|---|
| 4,405,875 A | * | 9/1983 | Nagai .................. 310/344 |
| 4,687,264 A | * | 8/1987 | Shuey .................. 439/92 |
| 5,810,332 A | * | 9/1998 | Vestergaard et al. ........ 251/368 |
| 5,977,668 A | * | 11/1999 | Yoshioka .................. 310/62 |
| 6,119,920 A | * | 9/2000 | Guthrie et al. ........... 228/123.1 |
| 6,194,250 B1 | * | 2/2001 | Melton et al. ............. 438/126 |
| 6,762,072 B2 | * | 7/2004 | Lutz ....................... 438/53 |
| 6,775,958 B2 | * | 8/2004 | Amako et al. ............. 53/478 |
| 6,962,834 B2 | * | 11/2005 | Stark ..................... 438/107 |
| 6,981,806 B2 | * | 1/2006 | Benzoni et al. ............ 385/94 |
| 7,176,555 B1 | * | 2/2007 | Jao et al. ................ 257/620 |
| 2004/0135510 A1 | * | 7/2004 | Bewlay et al. ............ 313/624 |
| 2005/0236161 A1 | * | 10/2005 | Gay et al. ................ 166/380 |

FOREIGN PATENT DOCUMENTS

| | | | | |
|---|---|---|---|---|
| JP | 402247093 A | * | 10/1990 | |
| JP | 404103142 A | * | 4/1992 | |
| JP | 02002246493 A | * | 8/2002 | |
| KR | 1996-8509 | | 6/2006 | |
| WO | WO/2004/068189 A2 | | 8/2004 | |

* cited by examiner

*Primary Examiner*—Samuel M. Heinrich
(74) *Attorney, Agent, or Firm*—Lowe Hauptman & Berner

(57) ABSTRACT

The present invention relates to a WLP fabrication method capable of welding a lid wafer with a device wafer by using laser illumination. The WLP fabrication method can rapidly weld bonding metal strips of device and lid wafers with each other in order to couple the lid wafer with the device wafer while sealing an internal cavity from the outside without giving any thermal effect to a drive unit in the device wafer.

7 Claims, 6 Drawing Sheets

WAFER LEVEL PACKAGE FABRICATION METHOD USING LASER ILLUMINATION

RELATED APPLICATION

The present application is based on, and claims priority from, Korean Application Number 2004-69892, filed Sep. 2, 2004, the disclosure of which is hereby incorporated by reference herein in its entirety.

BACKGROUND OF THE INVENTION

1. Field of the Invention

The present invention relates to a package fabrication method using laser illumination. More particularly, the present invention relates to a Wafer Level Package (WLP) fabrication method capable of welding a lid wafer with a device wafer by using laser illumination.

2. Description of the Related Art

As well known in the art, electronic devices such as a Film Bulk Acoustic Resonator (FBAR) and a Surface Acoustic Wave (SAW) filter are being rapidly reduced in size as well as required of high reliability.

In these days, electronic devices are being rapidly reduced in size and thickness according to various requirements such as functional improvement and reduction in power consumption and device size. FBARs largely used in mobile phones are also following this trend. In the FBARs, accordingly, Chip Size Packages (CSPs) are gradually drawing attention, and Wafer Level Packages (WLP) are also being attempted in various aspects in order to improve productivity while reducing fabrication cost. Such a WLP is generally regarded as a major decisive factor in the competitiveness of a product in the market.

A WLP FBAR as above includes a device wafer having a micro drive unit such as a circuit mounted thereon, a lid or cap wafer coupled to the top of the device wafer and a side wall made of a metal strip for coupling the periphery of the device wafer with that of the lid wafer while sealing an air cavity or internal space designed for seating the drive unit from the outside. The cavity functions to protect internal electrode patterns from bad effects of hostile environments and foreign materials.

WLP electronic devices are fabricated according to a conventional fabrication process as follows: First, a drive unit is formed on a wafer, a cavity surrounding the drive unit is formed, and then a cap or lid is covered on the cavity via adhesive or other suitable bonding techniques to seal the cavity. Since any materials deposited on the top of the drive unit degrades the performance of a device, it is important to separate the lid from the drive unit to a predetermined gap.

Generally in the conventional fabrication process, a plurality of drive units and cavities are generally formed on a bulk wafer, and the bulk wafer is cut into a plurality of package-sized unit wafers each having a drive unit and a cavity before the lid is covered on each of the unit wafers via adhesive and so on.

However, this process has a problem in that following process steps are difficult since the bulk wafer is cut into small package-sized unit areas. In addition, since the lid is coupled to the wafer via adhesive and so on, there is a drawback in that a junction is fragile to external thermal impact.

As an improvement, such a wafer level electronic device can be fabricated into a WLP based upon a technique for designing RF device packages, particularly, eutectic metal bonding.

The eutectic metal bonding hermetically couples a cap or lid to a wafer by using a low temperature thermal reflow technique or an ultraviolet lamp technique. In more detail, a bonding metal strip is formed around a drive unit on a device wafer thereby forming a cavity, a lid is covered on the strip, and the bonding metal strip is melted via the low temperature thermal reflow technique or the ultraviolet technique to couple the lid to the device wafer. Alternatively, a corresponding metal strip may be formed on the lid to bond with the metal strip on the device wafer.

However, the above low temperature or ultraviolet lamp technique has following drawbacks. First, since these bonding techniques are performed at a relatively low temperature, the bonding metal strip is heated for a long time exposed to a heat source and thus the drive unit of the device wafer is also heated along with the bonding metal. This as a result exposes the drive unit to the heat source for a long time, excessively raising the temperature of the drive unit, so that thermal impact is applied to the drive unit degrading its properties. In particular, these bonding techniques need a relatively long working time (e.g., several minutes), and thus cause a higher risk of degradation to the drive unit. In addition, the long bonding operation of the prior art increases the entire process time and thereby lowers the productivity of a packaging process.

In order to overcome the foregoing drawbacks, it is required for the bonding metal strip to couple the upper lid wafer and the lower device wafer together for a short time period in a relative low temperature range which does not give thermal impact or effect to the device drive unit. However, since the device drive unit is made of heat sensitive material such as Au, those metals can rapidly weld via the thermal reflow at a temperature range, which is low enough not to give any thermal impact to the heat sensitive material, are very rare.

SUMMARY OF THE INVENTION

The present invention has been made to solve the foregoing problems of the prior art and it is therefore an object of the present invention to provide a WLP fabrication method which can rapidly weld bonding metal strips of device and lid wafers with each other in order to couple the lid wafer with the device wafer while sealing an internal cavity from the outside without giving any thermal effect to a drive unit in the device wafer.

It is another object of the present invention to rapidly couple the device and lid wafers of the WLP by using the laser in order to shorten the entire WLP fabrication process thereby improving workability.

It is further another object of the present invention to bond metals or alloys together with the laser, applying a lower load to the wafers compared to a conventional thermal reflow, in order to prevent any degradation in bonding uniformity and reliability induced from the repulsive force of metal atoms.

It is other object of the present invention to couple a bulk lid wafer with a bulk device wafer before cutting a resultant bulk package into WLP unit in order to prevent high error rates induced from operations such as lid-mounting and metal strip-welding on small-sized wafers.

It is yet another object of the present invention to perform a bonding step to the bulk wafers in order to reduce the entire working time and therefore improve workability.

According to an aspect of the invention for realizing the object, there is provided a method for fabricating wafer level packages, the method comprising the following steps of:

(a) preparing a device wafer having a micro-drive unit arranged in at least one package area and an enclosed metal strip arranged along a periphery of the package area spaced from the drive unit;

(b) preparing a lid wafer having an enclosed metal strip formed thereon matching the metal strip on the device wafer;

(c) mounting the device wafer on a support member with the metal strip facing upward, and mounting the lid wafer on the device wafer with the metal strip of the lid wafer butting on the metal strip of the device wafer;

(d) illuminating a laser beam from a laser source onto the entire package area to weld the metal strips together without thermal effect to the drive unit so as to seal an internal space defined by the metal strips between the wafers; and (e) cutting a resultant structure along an outer periphery of a resultant welded metal strip.

Preferably, the mounting step (d) comprises mounting an upper jig on the lid wafer, the jig capable of transmitting the laser beam onto the package area.

Preferably, the metal strips are made of at least one selected from the group consisting of Sn, eutectic SnPb, Sn—Ag—Cu, Sn—Ag—Bi, Ag—Sn—Bi—In, Sn—Zn—Bi, An-Cu—Ni and AuSn alloys.

The illumination step (d) illuminates the laser beam preferably for about 0.01 to 10 seconds and more preferably for about 1 to 10 seconds.

Preferably, the illumination step (d) illuminates a plurality of package areas at the same time.

Preferably, the laser source is a YAG laser (1064 nm), a TAG laser or a laser diode (808 nm).

Preferably, the device and lid wafers are made of Si or glass.

Preferably, the lid wafer is made of transparent material.

DETAILED DESCRIPTION OF THE PREFERRED EMBODIMENT

A preferred embodiment of the present invention will now be described in detail with reference to the accompanying drawings.

Figure 1:
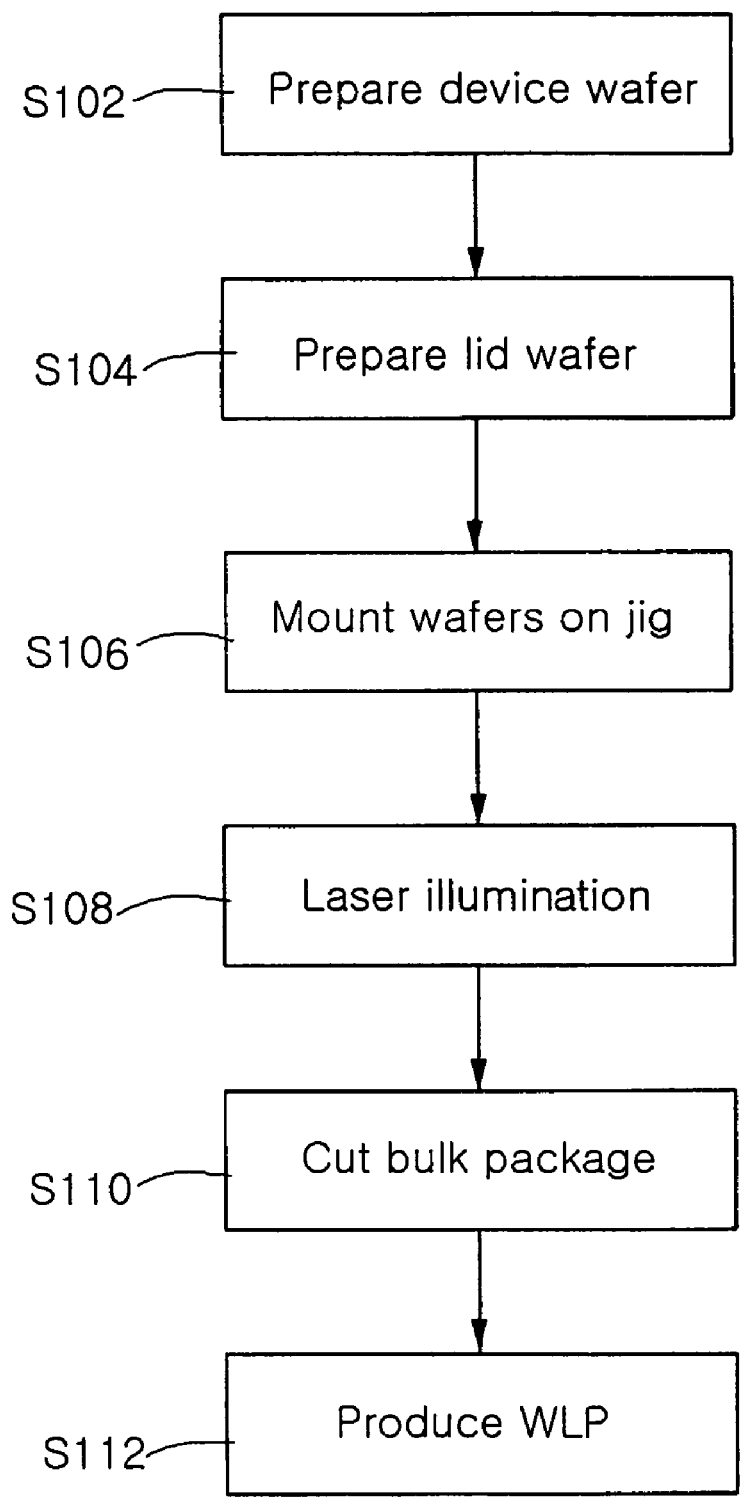
FIG. 1 is a flowchart illustrating a wafer level package fabrication process of the present invention.

A WLP fabrication process according to the preferred embodiment of the invention will be described in general with reference to FIG. 1, which is a flowchart illustrating the wafer level package fabrication process of the invention.

First, a bulk device wafer of predetermined thickness and area is prepared, and a plurality of drive units and enclosed bonding metal strips surrounding the respective drive units are formed on one side of the bulk device wafer in S102. Herein parts of the bulk wafer on which the drive units and the metal strips are will be referred to as "package areas" for the convenience's sake of description. Then, a bulk lid wafer of predetermined thickness and area is prepared, and a plurality of enclosed bonding metal strips are formed on one side of the bulk lid wafer to match the bonding metal strips on the bulk device wafer on S104. In S106, the bulk device wafer is mounted on a support, the bulk lid wafer is mounted on the device wafer so that the metal strips of the bulk lid wafer are aligned with the metal strips of the bulk device wafer, and an upper jig is further mounted on the bulk device wafer. Then, a laser beam is illuminated onto the bulk wafers from above to weld the metal strips of the bulk wafers, which are piled one atop the other, to produce a bulk package in S108.

In succession, the bulk package produced through the laser illumination is cut according to the package areas in S110 to produce a plurality of Wafer Level Packages (WLPs) in S112.

Figure 2A:
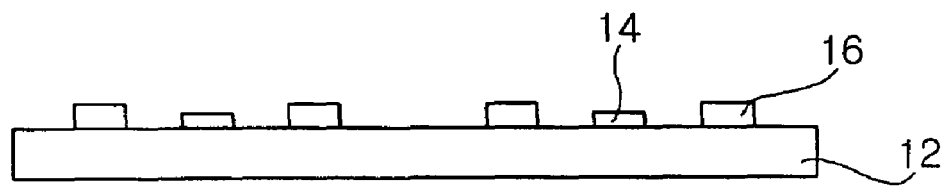
FIGS. 2A to 2E are cross-sectional views illustrating the wafer level package fabrication process of the present invention.
Figure 2B:
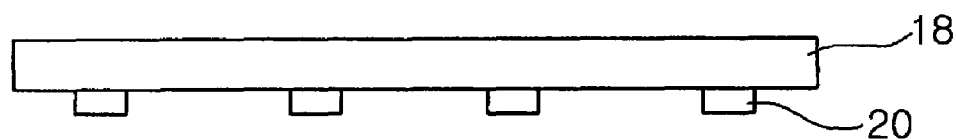
Figure 2C:
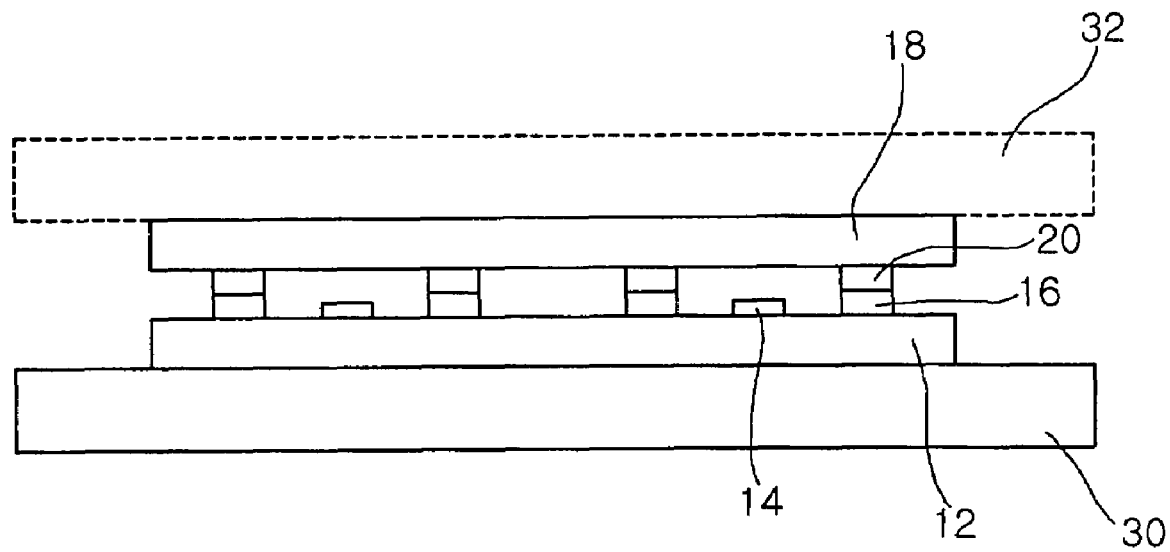
Figure 2D:
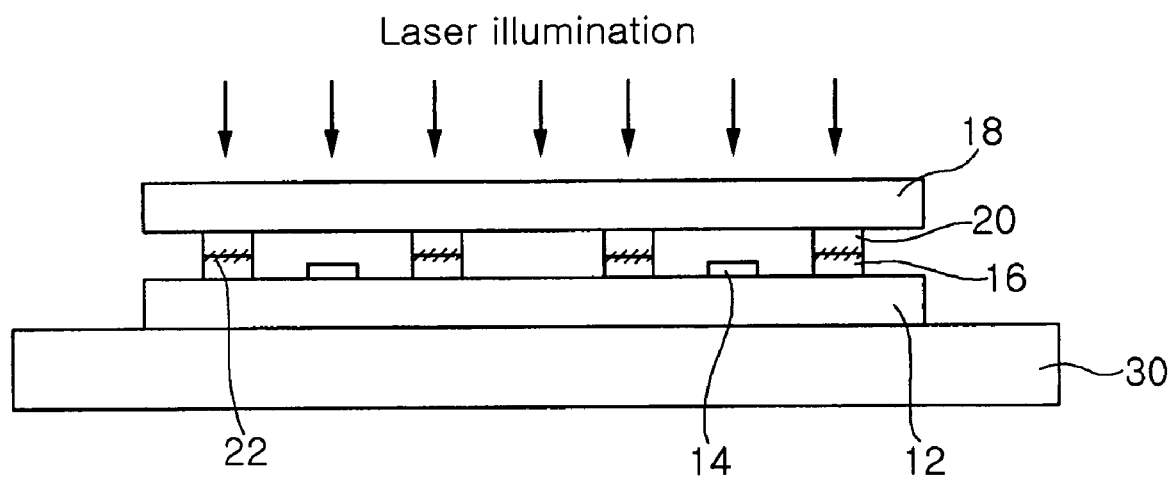
Figure 2E:
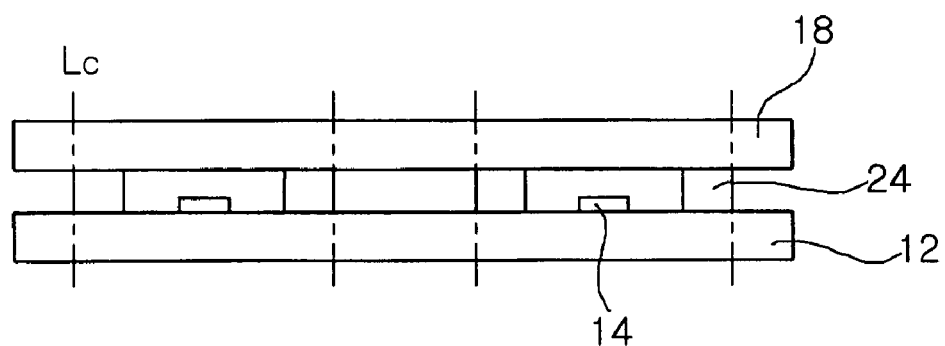

FIGS. 2A to 2E are cross-sectional views illustrating the wafer level package fabrication process of the present invention, in which FIG. 2A illustrates a step of forming drive units and bonding metal strips on a bulk device wafer, FIG. 2B illustrates a step of forming bonding metal strips on a bulk lid wafer, FIG. 2C illustrates a step of mounting the bulk device and lid wafers between a support and a jig, FIG. 2D illustrates a laser beam illumination step, and FIG. 2E illustrates a step of cutting a resultant bulk package.

As shown in FIG. 2A, a plate-shaped bulk device wafer 12 having suitable thickness and area is prepared, and a plurality of drive units 14 are formed on one side of the bulk device wafer 12 and bonding metal strips 16 are formed around the drive units 14, respectively.

The bulk device wafer 12 is made of for example Si or glass, and preferably has a thickness of about 1000 µm or less, and more preferably 700 µm or less. Each of the package areas has horizontal and longitudinal dimensions of about 1 mm or less, and each of the drive units 14 has a circuit formed of for example a metal pattern.

The metal pattern is generally made of at least one selected from the group consisting of Au, Cu, Mo, Pt, Ti and alloys thereof, in which melting points of Au, Cu, Mo, Pt and Ti are 1064, 1084, 2610, 1772 and 1675° C., respectively. Preferably, each of the bonding metal strips 16 has a thickness of 50 µm or less, and is made of a material of a melting point significantly lower than those of the above elements or their alloys consisting of the metal pattern. Suitable examples of the bonding metal strips 16 may include pure Sn, eutectic SnPb (63/37), Sn—Ag—Cu, Sn—Ag—Bi, Ag—Sn—Bi—In, Sn—Zn—Bi, An-Cu—Ni, AuSn alloy, AuSn (80/20) and so on, in which for instance pure Sn has a melting point of 231.79° C., eutectic SnPb (63/37) has a melting point of 182.8° C., and AuSn (80/20) has a melting point of 280° C.

Then, as shown in FIG. 2B, a plate-shaped bulk lid wafer 18 having suitable thickness and area is prepared, and a plurality of bonding metal strips 20 are formed to match the bonding metal strips 16 on the bulk device wafer 12 as shown in FIG. 2. The bulk lid wafer 18 is made of for example Si or glass, and preferably has a thickness of about 1000 µm or less, and more preferably 700 µm or less. The bonding metal strips 20 can be made of any of those materials adopted for the bonding metal strips 16 on the bulk device wafer 12. Alternatively, the bonding metal strips 20 can be made of any material capable of excellently welding with the bonding metal strips 16 on the bulk device wafer 12.

Upon the preparation of the bulk device and lid wafers 12 and 18 as above, as shown in FIG. 2C, the bulk device wafer 12 is mounted on a support 30 so that the drive units 14 and the bonding metal strips 16 are faced upward as shown in FIG. 2C, the bulk lid wafer 18 is placed on the bulk device wafer 12 so that the lid wafer metal strips 20 are aligned with and butt on the device wafer metal strips 16, respectively, and then an upper jig 32 (represented with a dotted line) is mounted on the bulk lid wafer 18.

The upper jig 32 functions to fix the bulk lid wafer 18 in position with respect to the bulk device wafer 12. The upper jig 32 is made of a transparent material such as glass. Alternatively, those parts of the upper jig 32 corresponding to the package areas may be so designed to transmit the laser beam.

Instead of the upper jig 32, different type of jigs or chucks may be used, which can grasp lateral portions of the bulk lid wafer 18 to locate the bulk lid wafer 18 in position with respect to the bulk device wafer 12 so that the upper side of the bulk lid wafer 18 is exposed from above.

In the meantime, when the bulk lid wafer 18 is mounted on the bulk device wafer 12, a suitable detecting means may be applied to detect whether or not the lid wafer metal strips 20 are aligned with and butted upon the device wafer metal strips 16 in order to adjust the position of the bulk lid wafer 18 in response to a detection result.

A suitable location detecting means may be also applied to more precisely adjust the position of the bulk device wafer 12 and the upper jig 32 when mounting the bulk device wafer 12 and the upper jig 32.

In addition, these detecting means may be connected to a control unit such as a computer in order to raise process precision as well as improve productivity.

Then, as shown in FIG. 2D, a laser beam (or beams) is illuminated from above onto the bulk wafers 12 and 18 so that the bonding metal strips 16 and 20 of the bulk wafers 12 and 18 form junctions 22 and completely bond together so that the bulk wafers produce a bulk package. In FIG. 2D, the upper jig 32 is not shown for the sake of brevity.

In this case, sources of the laser beam may include a Yttrium Aluminum Garnet (YAG) laser and a Terbium Aluminum Garnet (TAG) laser. As an instance, a laser welder is available from Pac Tech GmbH of Germany, in the model name of Laplace. In this case, the bulk wafers (e.g., 4 inch wafers) can be illuminated with a laser beam or laser beams having a wavelength of about 1064 nm (YAG) or 808 nm (TAG) under a maximum power of 1.5 kW for about 0.01 to 10 seconds, preferably, for about 0.1 to 1 seconds. Then, the laser illumination can weld the bonding metal strips 16 and 20 together without giving any thermal effect to the metal patterns such as the drive units 14 since the metal patterns have a melting point that is significantly higher than that of the bonding metal strips and thus the metal patterns are not influenced by the laser illumination which is continued only for a short time period to melt the bonding metal strips. In addition, since those metal patterns are of a layered structure which does not adopt any alloy between metal layers to lower the melting point, any thermal degradation does not take place. This as a result can realize the advantage of the invention capable of protecting the drive units from thermal impacts which have been a problem in the thermal reflow of the prior art.

On the other hand, although it has been described in FIG. 2D that the laser illumination is performed to illuminate two package areas, the laser illumination can be so performed to illuminate one package area or at least three package areas. Since a typical wafer level package has dimensions of about 3×3 mm and the laser as above illuminates a laser beam having a diameter of about 100 mm, the laser can illuminate several package areas at the same time.

It is required for about 10 minutes or less to perform the alignment of the bulk wafers 12 and 18 (see FIG. 2C) and the laser illumination (FIG. 2D), and the present invention can provide a working time within about 7 minutes.

Figure 3:
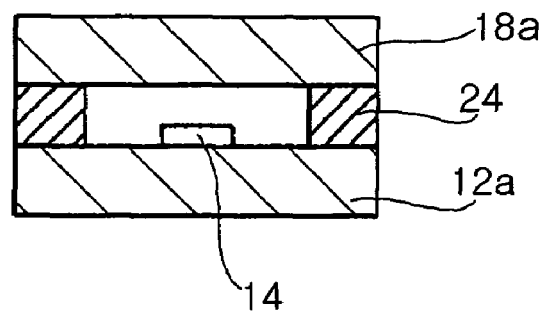
FIG. 3 is a cross-sectional view illustrating an exemplary wafer level package produced according to the wafer level package fabrication process of the present invention.

Then, the laser illumination as above causes the bonding metal strips 16 and 22 to completely bond together, thereby producing a bulk package having side walls 24 as shown in FIG. 2E. In succession, the bulk package is cut along cutting lines Lc to produce a plurality of wafer level packages or WLPs according to the package areas as shown in FIG. 3. The bulk package can be cut according to a number of well-known cutting techniques. For example, the bulk package can be cut into a plurality of WLPs through laser scribing.

In addition, the foregoing process steps can be performed under the control of a suitable control unit such as a computer in order to improve the workability and precision of the operation.

As described above, since the fabrication process of the invention comprises the step of coupling the bulk device wafer 12 with the bulk lid wafer 18 before cutting the bulk package into the respective WLP units, high error rates induced from operations such as lid-mounting and metal strip-welding on small-sized wafers can be prevented. Also, since the bonding step is performed to the bulk wafers, it is possible to reduce the entire working time and therefore improve workability.

FIG. 3 is a cross-sectional views illustrating an exemplary wafer level package produced according to the wafer level package fabrication process of the present invention.

As shown in FIG. 3, a wafer level package or WLP 10 produced according to the fabrication process of the invention includes a flat device wafer 12a having a drive unit 14 formed on the top thereof, a side wall 24 bonded to the upper periphery of the device wafer 12a and shaped as a metal strip to form a cavity around the drive unit 14 and a lid wafer 18a having the lower periphery bonded with the top of the side wall 24 to seal the cavity. The lid wafer 18a and the device wafer 12a have the same planar area, but may have a same or different thickness.

Figure 4:
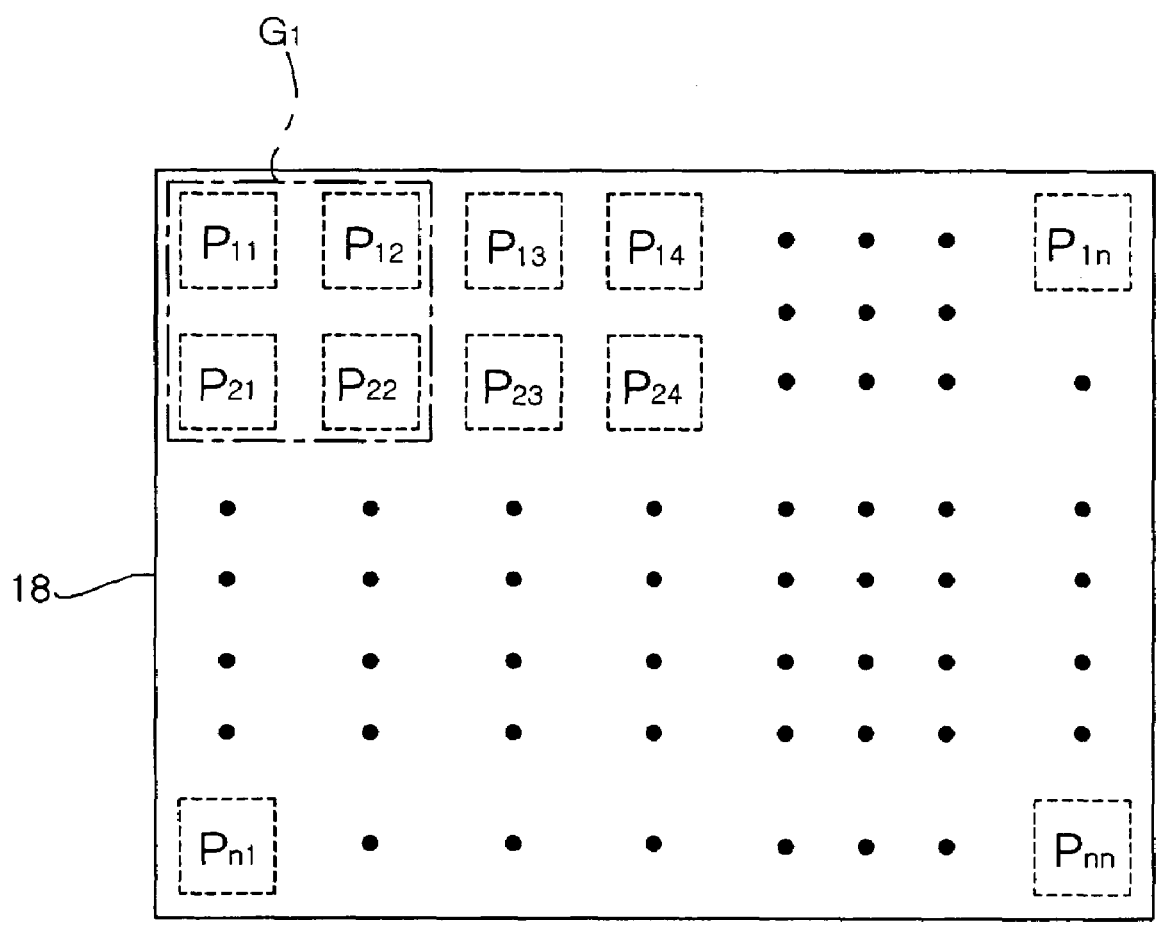
FIG. 4 is a plan view schematically illustrating selective laser illumination in the wafer level package fabrication process of the present invention.

FIG. 4 is a plan view schematically illustrating selective laser illumination in the wafer level package fabrication process of the present invention.

As shown in FIG. 4, N×N number of package areas P11, . . . and Pnn can be provided in the underside of one bulk lid wafer 18. In this case, the package areas can be grouped to be illuminated with a laser at the same time. For example, four package areas P11, P12, P21 and P22 can be collected into a group G1 as show in FIG. 4 to be illuminated with a laser beam. In this case, the entire package areas P11, . . . and Pnn can be laser-illuminated by exposing the group G1 first and then the next group including package areas P13, P14, P23 and P24 to the laser beam. Of course, the laser illumination is so performed that one package area is covered with a single laser beam at the same time.

A WLP produced was according to the WLP fabrication method of the present invention as described above, and a bonded state of the resultant WLP will described with reference to FIG. 5.

Four inch (4 in) bulk wafers having a thickness of 700 μm were used, and bonding metal strips were made eutectic Au/Sn (80/20) at a thickness of 50 μm. A laser source was a TAG laser welder commercially available from Pac Tech GmbH of Germany, in the model name of Laplace. A laser beam having a wavelength of about 808 nm was illuminated at an output power of about 400 W for about 0.1 seconds.

Figure 5:
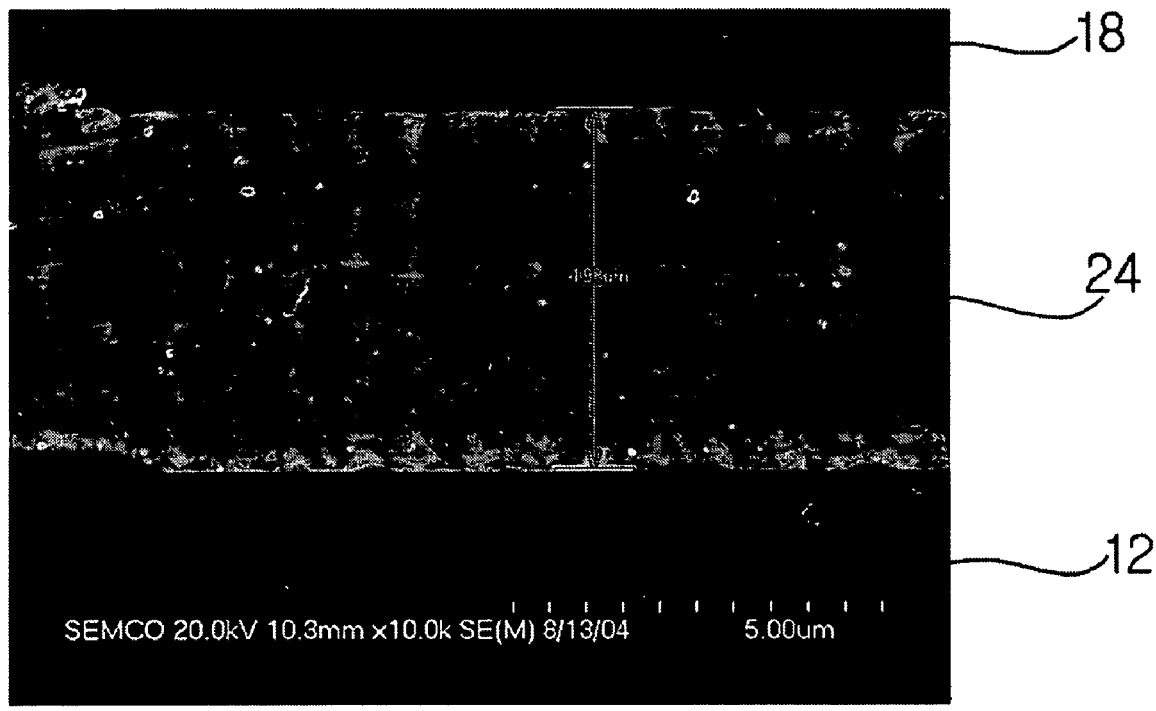
FIG. 5 is a cross-sectional view illustrating the bonded state of bonding metal in a wafer level package produced according to the present invention.

Upon the illumination as above, the bonding metal strips 24 were welded together as shown in FIG. 5, thereby coupling the upper-lid wafer 18 to the lower device wafer 12 while sealing the cavity in the lid and device wafers 18 and 12 from the outside.

The fabrication process as above is performed at a significantly short time period compared to the conventional thermal reflow, and thus it is possible to minimize or remove thermal effect or impact applied to the drive unit having the metal patterns.

Figure 6:
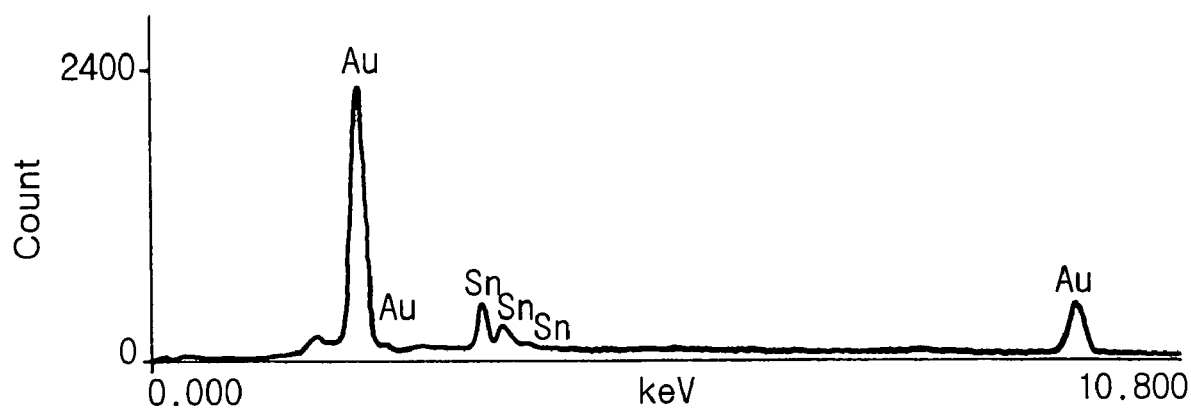
FIG. 6 is a graph illustrating the mechanical strength of exemplary bonding metal used in an experiment as shown in FIG. 5.

FIG. 6 together with Table 1 below reports EDS analysis results on the mechanical strength of Au/Sn used in FIG. 4. Referring to FIG. 6 and Table 1 below, it can be understood that Au/Sn has the most excellent mechanical strength at a ratio of about 8:2 (weight percent).

TABLE 1

| Contents | k-Ratio (Calorie) | ZAF | Atom (%) | Wt % | Wt % Error |
|---|---|---|---|---|---|
| Sn (L) | 0.1114 | 1.486 | 24.76 | 16.55 | ±0.79 |
| Au (L) | 0.8189 | 1.019 | 75.24 | 83.45 | ±1.80 |
| Total | | | 100.00 | 100.00 | |

(Chi-sqd = 1.13, Live time = 120.0 sec)

Since Au/Sn has a melting point of 280° C. at the above ratio, it can be suitably used as a bonding material of the invention.

As described above, the WLP fabrication method of the invention can rapidly weld the bonding metal strips of the device and lid wafers with each other in order to couple the lid wafer to the device wafer while sealing the internal cavity from the outside without giving any thermal effect to the drive unit in the device wafer.

In addition, the invention can rapidly couple the device and lid wafers of the WLP by using the laser in order to shorten the entire WLP fabrication process thereby improving workability.

Also, since the bulk lid wafer is coupled with the bulk device wafer before the bulk package is cut into the WLP units, high error rates induced from operations such as lid-mounting and metal strip-welding on the small-sized wafers can be prevented. Also, since the bonding step is performed to the bulk wafers, it is possible to reduce the entire working time and therefore improve workability.

Moreover, the invention bonds metals or alloys together with the laser, thereby applying a lower load to the wafers compared to the conventional thermal reflow, and therefore can prevent any degradation in bonding uniformity and reliability induced from the repulsive force of metal atoms.

While the present invention has been shown and described in connection with the preferred embodiments, it will be apparent to those skilled in the art that modifications and variations can be made without departing from the spirit and scope of the invention as defined by the appended claims.

In addition, while the FBARs and SAW filters have been disclosed as technical fields of the invention, the invention can be applied to all types of wafer level electronic devices that have air cavities to be sealed.

What is claimed is:

1. A method for fabricating wafer level packages, the method comprising the following steps of:
   (a) preparing a device wafer having a micro-drive unit arranged in a plurality of package areas, respectively and an enclosed metal strip arranged along a periphery of the package area spaced from the drive unit;
   (b) preparing a lid wafer made of a transparent material and having an enclosed metal strip formed thereon matching the metal strip on the device wafer;
   (c) mounting the device wafer on a support member with the metal strip facing upward, and mounting the transparent lid wafer on the device wafer with the metal strip of the lid wafer butting on the metal strip of the device wafer;
   (d) illuminating a laser beam from a laser source onto an entire area of at least one of the package areas through the lid wafer to weld the metal strips together so as to seal an internal space defined by the metal strips between the wafers, wherein the laser beam has a size larger than that of the at least one of the package areas; and
   (e) cutting a resultant structure along an outer periphery of a resultant welded metal strip,
   wherein the illumination step (d) comprises illuminating the laser beam for about 0.01 to 10 seconds so as to weld the metal strips together without thermal effect on the drive unit.

2. The method for fabricating wafer level packages according to claim 1, wherein the mounting step (d) comprises mounting an upper jig on the lid wafer, the jig capable of transmitting the laser beam onto the package area.

3. The method for fabricating wafer level packages according to claim 1, wherein the metal strips are made of at least one selected from the group consisting of Sn, eutectic SnPb, Sn—Ag—Cu, Sn—Ag—Bi, Ag—Sn—Bi—In, Sn—Zn—Bi, An-Cu—Ni and AuSn alloys.

4. The method for fabricating wafer level packages according to claim 1, wherein the device and lid wafers are made of Si or glass.

5. The method for fabricating wafer level packages according to claim 1, wherein the illumination step (d) illuminates the laser beam for about 1 to 10 seconds.

6. The method for fabricating wafer level packages according to claim 1, wherein the illumination step (d) illuminates a plurality of package areas at the same time.

7. The method for fabricating wafer level packages according to claim 1, wherein the laser source is a YAG or TAG laser.

* * * * *